United States Patent

Zaman, III

[15] 3,679,986

[45] July 25, 1972

[54] NON-LINEAR FEEDBACK GAIN CONTROL AND PEAK DETECTOR SYSTEM

[72] Inventor: Louis F. Zaman, III, Endicott, N.Y.

[73] Assignee: International Business Machines Corporation, Armonk, N.Y.

[22] Filed: Sept. 4, 1970

[21] Appl. No.: 69,645

[52] U.S. Cl. ....................330/86, 330/29, 330/141

[51] Int. Cl. ....................H03g 3/30

[58] Field of Search....................330/29, 86, 139, 141, 144, 330/145

[56] References Cited

UNITED STATES PATENTS

| | | | |
|---|---|---|---|
| 3,398,395 | 8/1968 | Ward | 330/144 X |
| 3,488,604 | 1/1970 | Smilowitz | 330/29 |
| 3,206,689 | 9/1965 | Santana | 330/144 X |
| 3,536,858 | 10/1970 | Limbaugh et al. | 330/29 X |

*Primary Examiner*—Roy Lake
*Assistant Examiner*—James B. Mullins
*Attorney*—Hanifin and Jancin and Paul M. Brannen

[57] ABSTRACT

A non-linear feedback gain control and peak detector system in which the output of an amplifier is compared with a reference voltage, and the error or difference therebetween is stored in a hold circuit which in turn controls the gain of the amplifier. Peak detection is accomplished by providing an output from the feedback control circuit, which provides a signal when the first voltage peak reaches its maximum value.

6 Claims, 4 Drawing Figures

*INVENTOR*
LOUIS F. ZAMAN, III

*BY* Paul M. Brannen

*AGENT*

NON-LINEAR FEEDBACK GAIN CONTROL AND PEAK DETECTOR SYSTEM

FIELD OF THE INVENTION

This invention relates generally to automatic gain control systems and in particular to an automatic gain control system having non-linear characteristics and having the capability of providing a peak detector output indicative of the input voltage attaining its peak or maximum value.

DESCRIPTION OF THE PRIOR ART

Automatic gain control systems operating on a continuous and linear basis have been employed, for example, in radio receivers, in the past. Also, it has been known to establish threshold levels for time varying signals by using some initial portion of the signal to set a threshold value for the remainder of the signal. Such known arrangements, however, are relatively costly in terms of the apparatus required to perform these functions. Also, with such systems, the provision of peak detection was handled by separate or distinct circuitry, thus enlarging the total amount of apparatus required where both functions were desired.

SUMMARY OF THE INVENTION

It is a principal object of this invention to provide an improved automatic gain control system in which a feedback control circuit is arranged to provide an output signal indicative of the input signal having attained a maximum value.

Another object of the invention is to provide an improved automatic gain control system which employs a novel incremental non-linear feedback control which approximates a continuous linear feedback system, but at a reduced cost.

A further object of the invention is to provide a system of the type described which is particularly adapted to set the system gain on the first peak of the input signal and to monitor the gain for the duration of the signal.

Another object of the invention is to provide an improved and economical automatic gain control system for use in circumstances where first input signal peak distortion is acceptable.

A further object of the invention is to provide an improved automatic gain control system in which a greater stability is achieved during incremental operation of the system, without the use of expensive hardware.

Other objects of the invention and features of novelty and advantages thereof will be apparent from the following detailed description of a preferred embodiment of the invention, taken in connection with the accompanying drawings.

Briefly described, this invention contemplates a controlled amplifier, such as an operational amplifier having a controlled feedback impedance, to which the input signal is supplied. The output signal may be supplied to an output terminal through a second conventional amplifier, or directly, as suits design considerations. The output signal is also supplied to one input of a first differentially controlled current source, the output of which is supplied to a storage device, such as a capacitor, and also is supplied to a controllable impedance, such as a field effect transistor, connected to the variable gain amplifier. A second differentially controlled current source is also connected to the control circuit and control capacitor, to provide means for resetting the control voltage to a suitable initial value, such as ground potential, at the end of an operating cycle. A suitable amplifier is connected to the control circuit to provide a peak detection signal, which changes state at the time the input signal has peaked and is just beginning to decrease.

GENERAL DESCRIPTION OF THE DRAWINGS

DESCRIPTION OF THE PREFERRED EMBODIMENT

Figure 1:
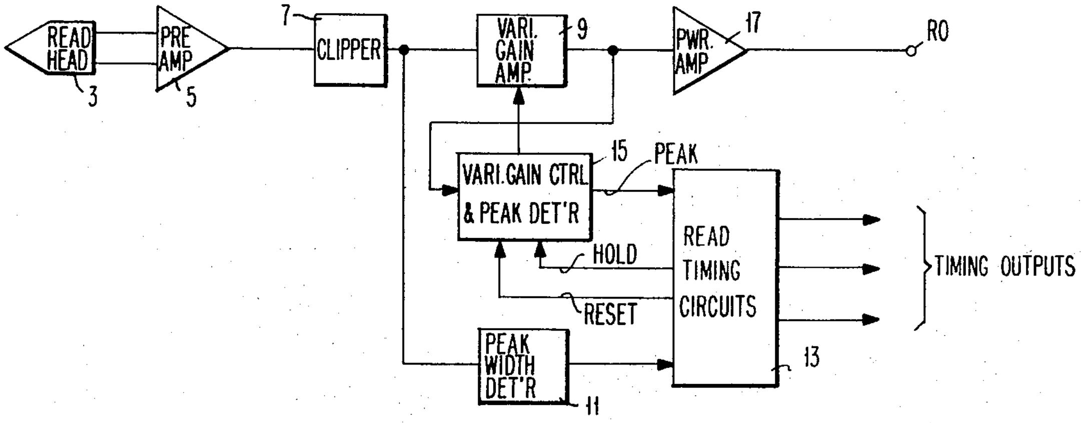
FIG. 1 is a schematic illustration of a portion of a magnetic ink character recognition system, showing one use for a system embodying the present invention.

FIG. 1 shows in a broadly schematic form, one arrangement of data preprocessing circuitry which may be employed in connection with a magnetic ink character recognition system, and which embodies a gain control and peak detector of the type embodying the present invention.

Magnetic ink characters are scanned by a single gap read head 3, to provide analog voltage waveforms which are distinct for each of the characters to be recognized. The analog character signals are amplified in a suitable preamplifier 5, and clipped by conventional clipping circuits 7. The signals are then supplied to the inputs of a variable gain amplifier 9 and an input of a peak width detector 11. The output of the peak width detector is supplied as an input to read timing circuits 13, which provide a plurality of timed output circuits having pulses or signal levels thereon, denoting various time intervals following the initiation of a character waveform. A plurality of timing outputs are provided as shown, and are supplied to the recognition circuitry. This recognition circuitry is neither shown nor described herein, since it may take any one of a number of forms, and the actual configuration of the circuitry is not germane to the present invention. The read timing circuits are also governed by the output of the variable gain control and peak detector circuitry 15, which is governed in part by the output of variable gain amplifier 9. In turn, the variable gain control and peak detector 15 supplies a control signal to the variable gain amplifier 9, which sets the gain of this amplifier, as will be subsequently described in detail. The signals from variable gain amplifier 9 are also supplied as an input to a power amplifier 17, the output of which is supplied to a terminal RO and thence to the recognition circuitry for analysis.

The variable gain amplifier 9 is set to some initial value, and as the input signal waveform is supplied to the circuitry, the output of amplifier 9 is supplied to the control circuit 15, which provides an output on the line PEAK, when the first positive peak of the input signal waveform reaches its maximum value. At this time a suitable output signal is supplied from read timing circuits 13 on the line designated HOLD, which then acts to hold the control voltage established by the circuitry 15 to some value which governs the gain of the variable gain amplifier 9 and maintains it at a set value until the end of the input signal waveform, at which time an output is supplied on the line reset from timing circuits 13, which resets the variable gain control and peak detector circuits 15 in preparation for the next signal waveform.

Figure 2:
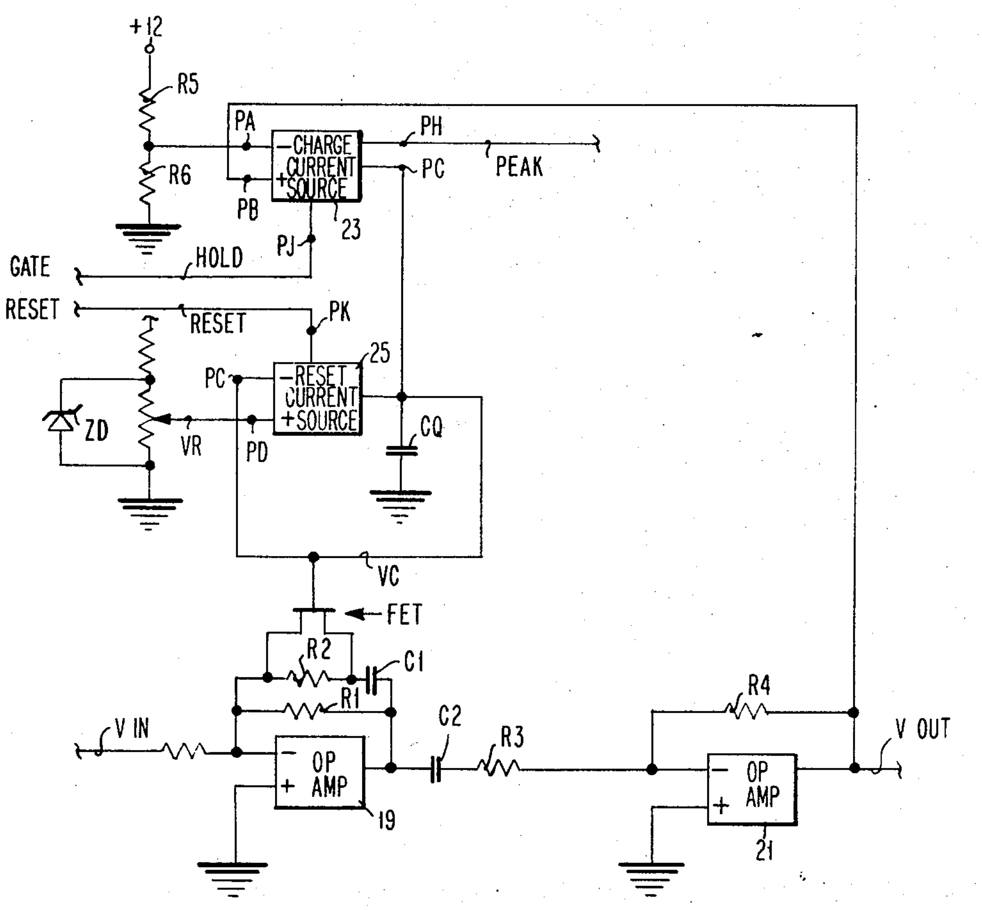
FIG. 2 is a block diagram showing the broad concept of the present invention, without reference to specific circuit components.

Referring now to FIG. 2, the variable gain amplifier may actually comprise an operational amplifier 19 of conventional form, one input of which is connected to ground, as shown, and the other of which is connected through the usual input impedance to the source of input voltage designated as VIN. This would correspond in the system drawing of FIG. 1 to the output of the clipper 7. In accordance with usual practice, a feedback impedance is connected between the output of the operational amplifier 19 and its input. In the present instance, it is apparent from inspection of the drawings that this comprises the parallel circuit including the resistor R1, in parallel with a second resistor R2 and a capacitor C1 connected in series. A field effect transistor FET, has its output connected across the terminals of resistor R2, so that variations in the signal voltage supplied to the field effect transistor will cause an effective change in the feedback impedance for operational amplifier 19. The output of amplifier 19 is supplied via a resistor R3 and a capacitor C2, to the input of a second operational amplifier 21, the other input of which is grounded as shown. A conventional feedback resistor R4 is also connected between the output of amplifier 21 and its input. The amplifier 21 has its output connected to an output circuit to supply signals on a line designated as VOUT, which would correspond to the output of variable gain amplifier 9, shown in the system drawing of FIG. 1. This output is also connected as one input to a differential amplifier 23, the other input of amplifier 23 being connected to a voltage divider comprising resistors R5 and R6, connected between a suitable source of potential herein designated as +12, and ground, so that a fixed or reference voltage is supplied to the second input of amplifier 23. Operation of the charge current source 23 is governed by a control signal on the input line designated HOLD. The charge current source 23 has two outputs, one on a line designated PEAK, which provides a digital signal indicating that the input signal supplied from amplifier 21 has reached a maximum or peak value, and a second output on a line designated VC, which constitutes a control voltage for the field effect transistor FET, as well as supplying an input to an energy storage device such as the capacitor CQ.

A second differential stage 25, designated as RESET CURRENT SOURCE, has the line VC connected thereto as one input, the other input being a constant or reference voltage VR, supplied from a voltage divider which includes a Zener diode ZD, which acts as a voltage regulating device. The single output of the reset current source stage 25 is connected to the line VC, as shown.

The gain of amplifier 19 is initially set to some predetermined value and as the signal through the amplifier from the line VIN increases, the control voltage on the gate or input of the field effect transistor FET is increased and maintains the output at a constant level. In this manner, a first peak of each input waveform supplied on the line VIN is normalized to a predetermined voltage at the line VOUT.

The voltage appearing on the line VC is stored by the capacitor CQ, and as the signal increases above the initial threshold value, the charge current source 23 supplies a charging current to the capacitor causing the control voltage to increase. This increase in control voltage will cause an increase in the impedance of the field effect transistor FET and accordingly, the gain of amplifier 19 will be lowered. This charging current from source 23 will increase and decrease as a non-linear function of the input signal until the first peak is detected. The use of an appropriate value of capacitance for capacitor CQ will provide the proper degree of non-linearity. At this time, an output signal on the line PEAK will cause the timing circuits to return a control signal on the line HOLD, which turns the charging current source 23 off and thereafter the control voltage VC will be held constant until the end of the allotted time for the analog waveform to have completed its cycle at which time a signal from the timing circuits on the line RESET will cause the control voltage to be reset to some value determined by the reference voltage on the line VR.

Within the charging source of circuit 23, circuitry is provided for sensing the presence or absence of the charging current to provide an appropriate signal on the PEAK output line indicating that a maximum signal or peak has been attained for the input signal waveform. The digital output on the line PEAK goes to a negative value when the signal crosses the initial threshold value and after the signal has reached a maximum or peak and starts to decrease, the digital output on this line will go positive. A suitable small delay in operation will prevent the digital output from switching back and forth with minor variations (due to non-linear operation) in the charging current, but it will not adversely affect the location of the maximum or peak signal.

Figure 3:
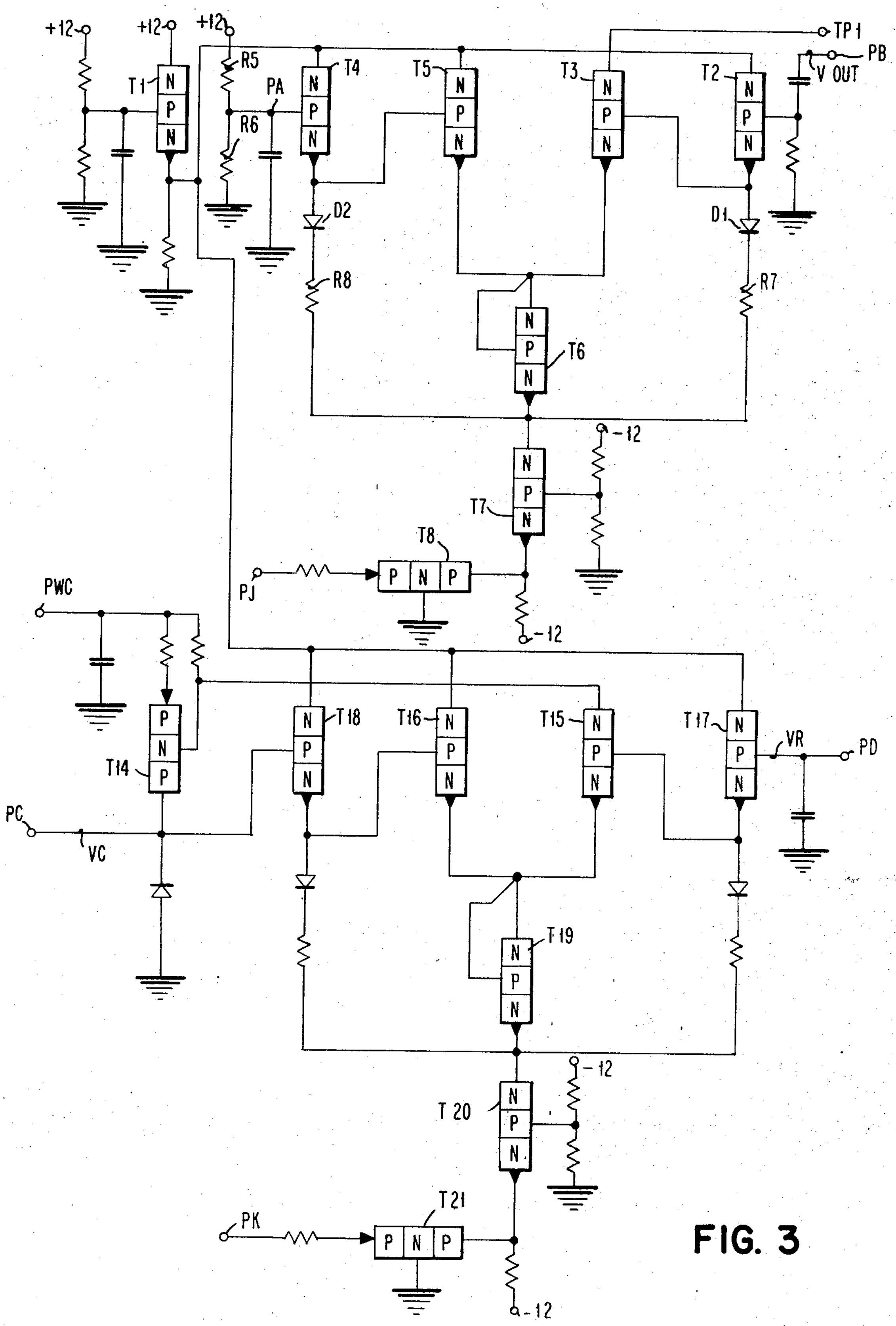
FIGS. 3 and 4 are detailed circuit drawings illustrating the manner in which certain portions of the system shown in FIG. 2 may be embodied in conventional transistor circuitry.
Figure 4:
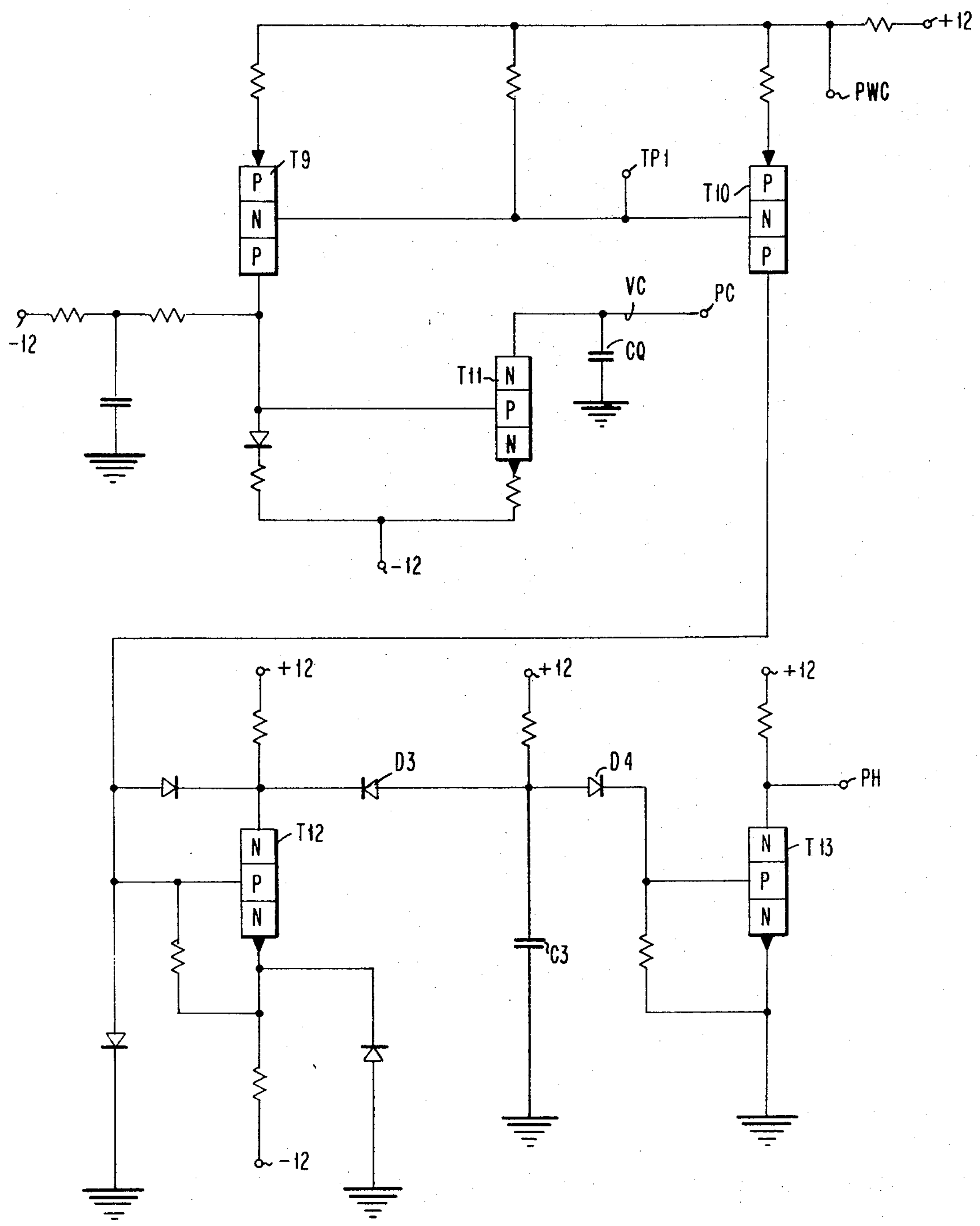

Referring now to FIGS. 3 and 4, there is shown therein detailed circuitry embodying conventional junction transistors and other electronic circuit components, and illustrating one form which the current sources 23 and 25 may take, along with the additional circuitry for providing the peak output signal. In order to show the relationship between the detailed circuitry of FIGS. 3 and 4 and the more schematic block diagram of FIG. 2, a plurality of terminal points has been illustrated in FIGS. 2, 3 and 4. These terminal points refer to similar circuit locations in each of the several views. It will be understood, of course, that variations are possible in the detailed circuit configurations, and that the invention is not limited to the details of the circuits as shown, except by the scope of the appended claims.

Examination of FIG. 3 will reveal the symmetry of the circuits, one current source corresponding to the charge current source 23 being shown in the upper portion of the drawing, while the second or reset current source 25 is shown in the lower portion of FIG. 3. Also, the symmetry of the drawings quickly reveals that these current sources comprise differentially connected stages, with suitable constant current connections in the common portion of the stages, as well as common gate circuits for each of the first and second sources.

A transistor T1 has a fixed bias supplied to its base, and has its emitter coupled to a common connection to plurality of transistor collectors shown in FIG. 3, to afford suitable operating voltage. The signal on line VOUT, is supplied via a terminal PB to the base of a transistor T2, which has its emitter coupled to a transistor T3. On the other side of this differential stage, a reference signal from the voltage divider, including resistors R5 and R6, is supplied via a terminal VA to the base of transistor T4, which in turn has its emitter coupled to the transistor T5. Transistors T3 and T5 are connected in a common emitter configuration via transistor T6 to a junction point to which the emitters of transistors T2 and T4 are also connected via diodes D1, D2 and resistors R7, R8. This junction point is connected to the collector of a transistor T7, which has a reference voltage applied to its base and has its emitter connected to the HOLD signal line via a terminal PJ and a gating transistor T8. The collector of transistor of T3 in FIG. 3 is connected via the terminal TP1 to the bases of transistors T9 and T10 in FIG. 4. The output of transistor T9 is supplied to the base of a transistor T11, the output of which is connected to the storage capacitor CQ, and the line VC, via the terminal PC. The output of transistor T10 is supplied to the input of transistor T12, which in turn supplies an output signal via the diodes D3 and D4 to the base of a transistor T13, the collector of which is connected to terminal point PH. This represents the peak output signal. Capacitor C3 in this circuit operates to discern a change in the charging current and hence, provide an output at the time the input signal waveform is beginning to decrease from its maximum value.

The reset current source shown in the bottom of FIG. 3 includes a power connection PWC from the bus which supplies transistors T9 and T10 in FIG. 4, and it supplies power to a transistor T14, the base of which is connected to one of a pair of differentially connected transistors T15 and T16, the collector of T14 being connected to the line VC at terminal PC. This forms the loop connection shown in FIG. 2 from the output of the reset current source 25 to one of its two inputs.

Inputs to transistors T15 and T16 are supplied from transistors T17 and T18, respectively, the transistor T17 being governed by the reference voltage VR supplied at terminal PD, while the input transistor T18 has the signal on line VC applied to its base by its connection to the terminal PC. The emitters of the differentially connected transistors are commonly connected to transistors T19 and T20, as described previously in connection with the charging current source, and a gating transistor T21 provides the control signal on the reset line from terminal PK to govern the operation of this circuit.

The control storage capacitor CQ is selected to have a capacitance such that it not only maintains the proper controlling level after the first peak has been attained, but also permits stability with a much higher loop gain during the rise interval, and, if desired, the fall interval of the input waveform, and thereby achieves an arbitrarily high compression ration, limited only by the variable impedance employed in the control circuit.

Although a plurality of the minor components of these detailed circuits have not been explicitly described, it will be apparent to those skilled in the art that these function in the usual manner to provide proper biasing and clamping or clipping controls, and detailed description of these components is deemed unnecessary.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An automatic gain control system comprising, in combination a variable gain amplifier having an input, an output, and a control circuit and arranged to vary the amplification of a signal supplied to the input in accordance with the variation of a control signal supplied to said control circuit, a control signal storage device, first current source means connected to said storage device for supplying energy at a predetermined rate to said control signal storage device, said first current source means being connected to the output of said amplifier and rendered effective at the beginning of an input signal to said variable gain amplifier to supply energy to said storage device, second current source means connected to said storage device for removing energy at a predetermined rate from said control signal storage device, said second current source means being governed by said first current source and rendered effective at the end of a predetermined time interval following the beginning of said input signal to said variable gain amplifier, and peak detector means connected to said first current source means, comprising means for detecting the termination of energy supply to said storage device and providing a peak detector output signal upon said termination.

2. An automatic gain control system as claimed in claim 1, in which said control signal storage device comprises a capacitor which is charged by said first source and discharged by said second source.

3. An automatic gain control system as claimed in claim 2, in which said first and second current sources comprise differentially connected stages having two inputs, one of which is connected to a reference potential and the other of which is connected to receive an input signal, the first current source connected to and receiving a control signal from the output of said variable gain amplifier, and the second current source connected to and receiving a control signal from the output of said first current source.

4. An automatic gain control system as claimed in claim 3, in which each of said current sources further includes a gating circuit for rendering said source effective, the gating circuit for said first source governed by the input to said amplifier and rendering said first source effective at the beginning of the input waveform to the system, and the gating circuit for the second source governed by the input to the amplifier rendering said second source effective following the completion of the input waveform.

5. An automatic gain control system as claimed in claim 4, in which the peak detector means includes resistance capacitance circuit delay means for rendering the peak detector means immune to short time variations in the charging current to said capacitor.

6. In an automatic gain control system, in combination, an operational amplifier having an input to which incoming signal waveforms are supplied, and an output from which output signal waveforms are supplied, said operational amplifier further including a feedback impedance connected between said input and said output, controllable impedance means connected in parallel with said feedback impedance, and having a control terminal to which gain control signals are supplied to thereby vary the impedance of said controllable impedance of said controllable impedance means, a gain control capacitor connected to said controllable impedance means, a first current source connected to said capacitor for supplying charging current to said control capacitor, said first current source being connected to and responsive to the output of said operational amplifier, a second current source connected to said capacitor for discharging said control capacitor, said second current source being connected to and responsive to the output of said first current source, and control means connected to said first and said second current sources for governing their operation in coordinated time relationship to the signal waveforms supplied to the system.

* * * * *